United States Patent
Yonovitz

(12) 
(10) Patent No.: US 9,696,962 B1
(45) Date of Patent: Jul. 4, 2017

(54) HARMONIC TRACKING EQUALIZER

(71) Applicant: David Yonovitz, Del Mar, CA (US)

(72) Inventor: David Yonovitz, Del Mar, CA (US)

( * ) Notice: Subject to any disclaimer, the term of this patent is extended or adjusted under 35 U.S.C. 154(b) by 0 days.

(21) Appl. No.: 15/257,476

(22) Filed: Sep. 6, 2016

(51) Int. Cl.
*H03G 5/00* (2006.01)
*G06F 3/16* (2006.01)

(52) U.S. Cl.
CPC .................... *G06F 3/165* (2013.01)

(58) Field of Classification Search
CPC .... H04R 3/04; H04R 2430/03; H04R 1/2811; H04R 1/2819; H04R 3/002; H04R 3/00; H04R 3/08; H04R 2430/01; H04R 15/00; H04R 2460/13; H04R 3/007; H04R 17/005; H04R 1/1016; H04R 2201/023; H04R 2217/03; H04R 2420/07; H04R 25/02; H04R 29/001; H04R 29/003; H04R 9/063; H04R 9/066; H04R 17/00
USPC ... 381/103, 1, 104, 107, 119, 120, 162, 185, 381/26, 388, 55, 59, 63, 94.1, 98
See application file for complete search history.

(56) References Cited

U.S. PATENT DOCUMENTS

| | | | | |
|---|---|---|---|---|
| 4,327,372 A * | 4/1982 | Van der Valk | ....... | H04N 11/183 348/642 |
| 6,014,897 A * | 1/2000 | Mo | ..... | G01S 7/52047 367/135 |
| 9,236,842 B2 * | 1/2016 | Katsianos | | |
| 2003/0020989 A1 * | 1/2003 | Liu | ..... | H04B 10/2941 398/147 |
| 2013/0163784 A1 * | 6/2013 | Tracey | ..... | H03G 3/00 381/103 |

* cited by examiner

*Primary Examiner* — Akelaw Teshale
(74) *Attorney, Agent, or Firm* — Merle W. Richman; TechLaw LLP

(57) ABSTRACT

The Harmonic Tracking Equalizer (HTEq) is an apparatus for and method of carrying out harmonic tracking equalization processing of an electrical signal, and apparatuses for and methods of controlling such equalization processing of the signal to dynamically sense the time-varying spectrum of an input signal and closely match a user desired audio signal spectrum while preserving the original dynamic range of the signal. The harmonically (sub-harmonically) tracked equalization is according to a user specified spectral request specified by a control interface that allows a user to request an amount of equalization to be applied to the signal. This apparatus is intended to process audio signals; though, it has general application to waveforms of other source and higher frequency content.

18 Claims, 10 Drawing Sheets

HTEq Functional Block Diagram

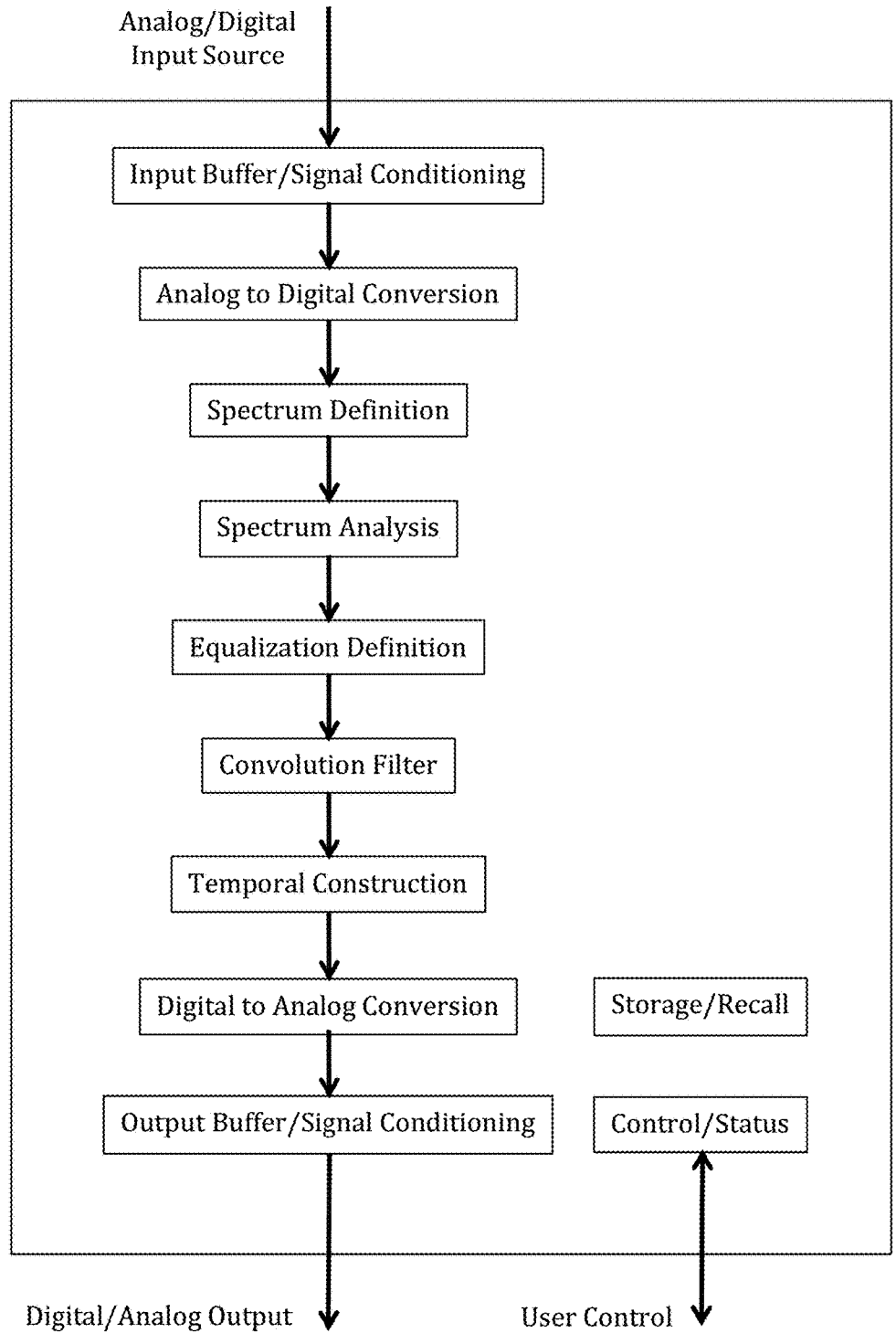
FIG 1. HTEq Functional Block Diagram

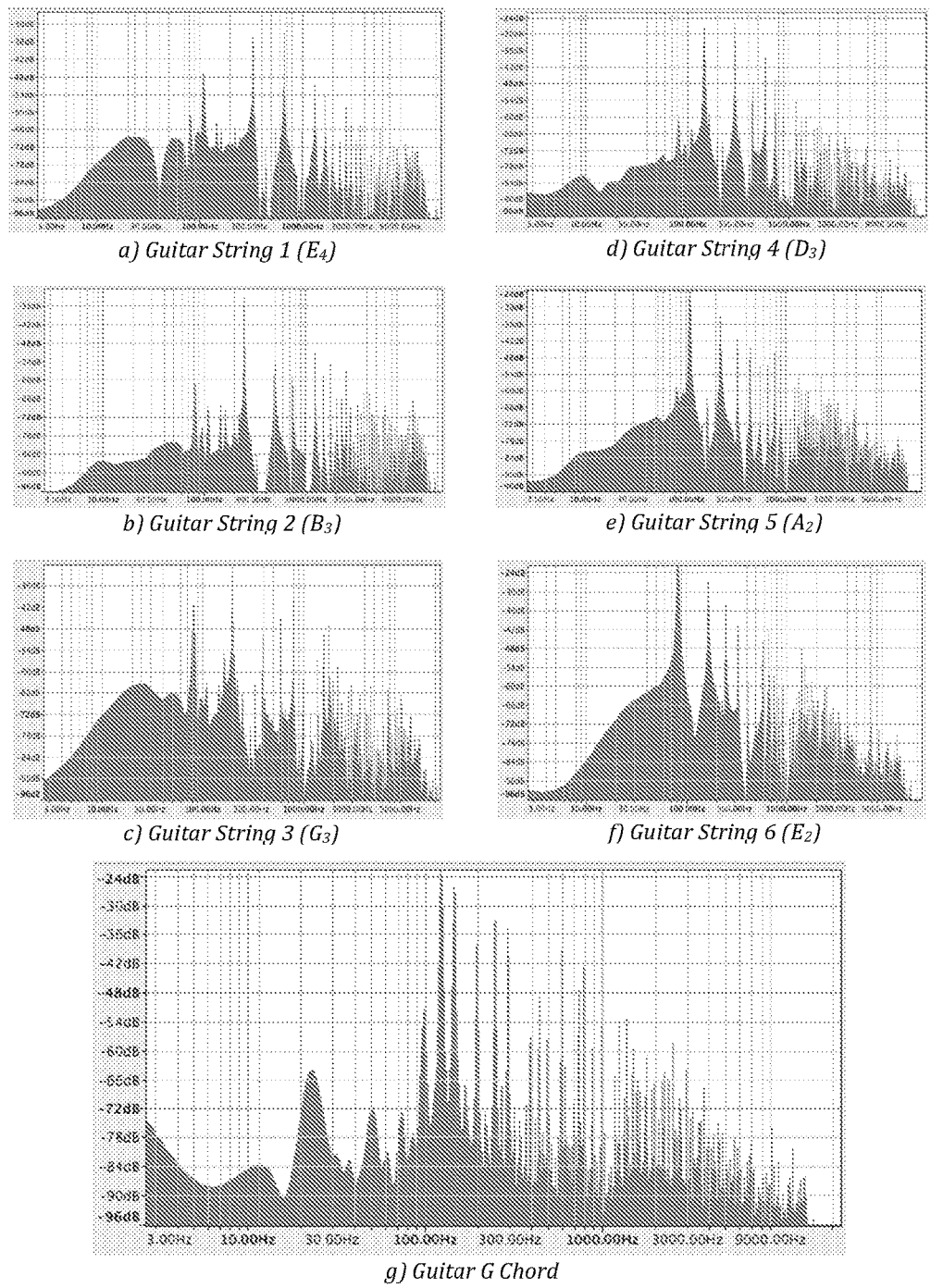
Figure 2. Typical Non-Static Complex Audio Input Spectrum (Acoustic Guitar)

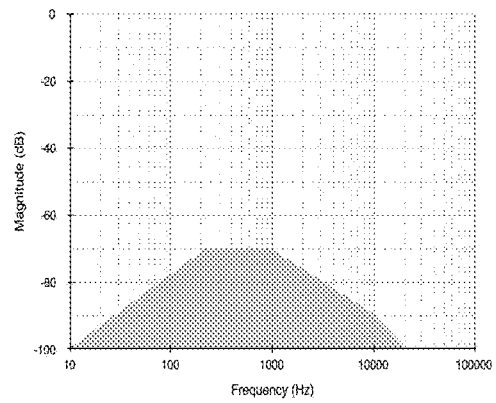
*a) Input Noise Spectrum*
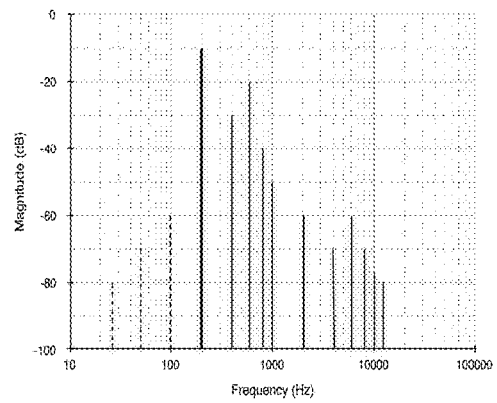
*b) Input Signal Spectrum*
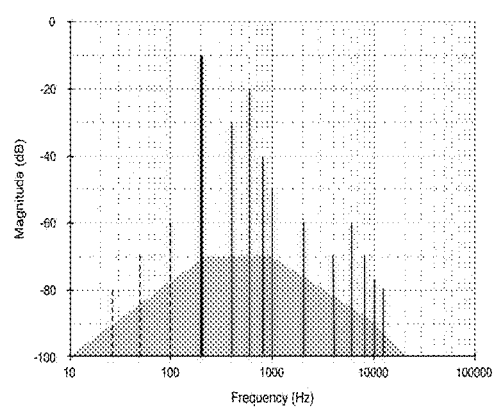
*c) Input Spectrum*
d) Input Signal Components
Fundamental (Hz):
- 200
Harmonics (Hz):
- 400
- 600
- 800
- 1000
- 2000
- 4000
- 6000
- 8000
- 10000
- 12000
Sub-Harmonics (Hz):
- 100
- 50
- 25
FIG 3. Example Input Signal and Noise Spectrum

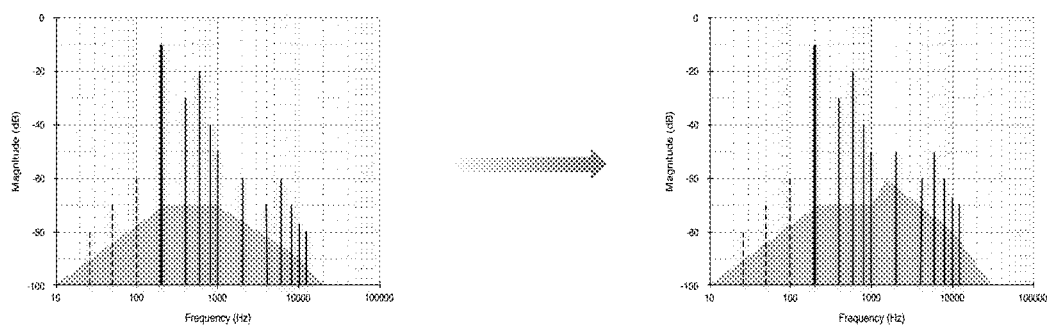
FIG 4. Input Spectrum Modified by Shelving Filter; 10 dB Gain, > 1000 Hz.

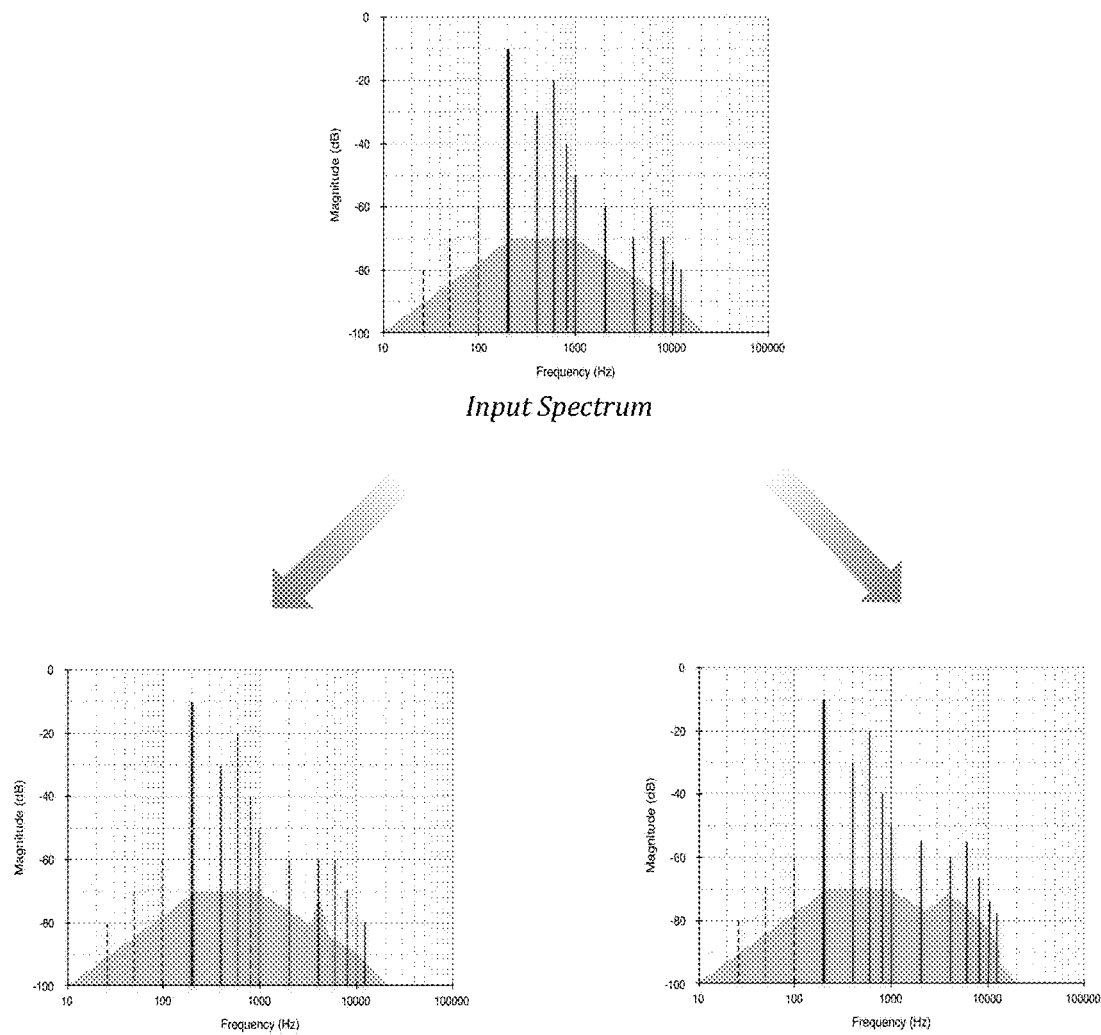
FIG 5. Input Spectrum Modified by Parametric Filter

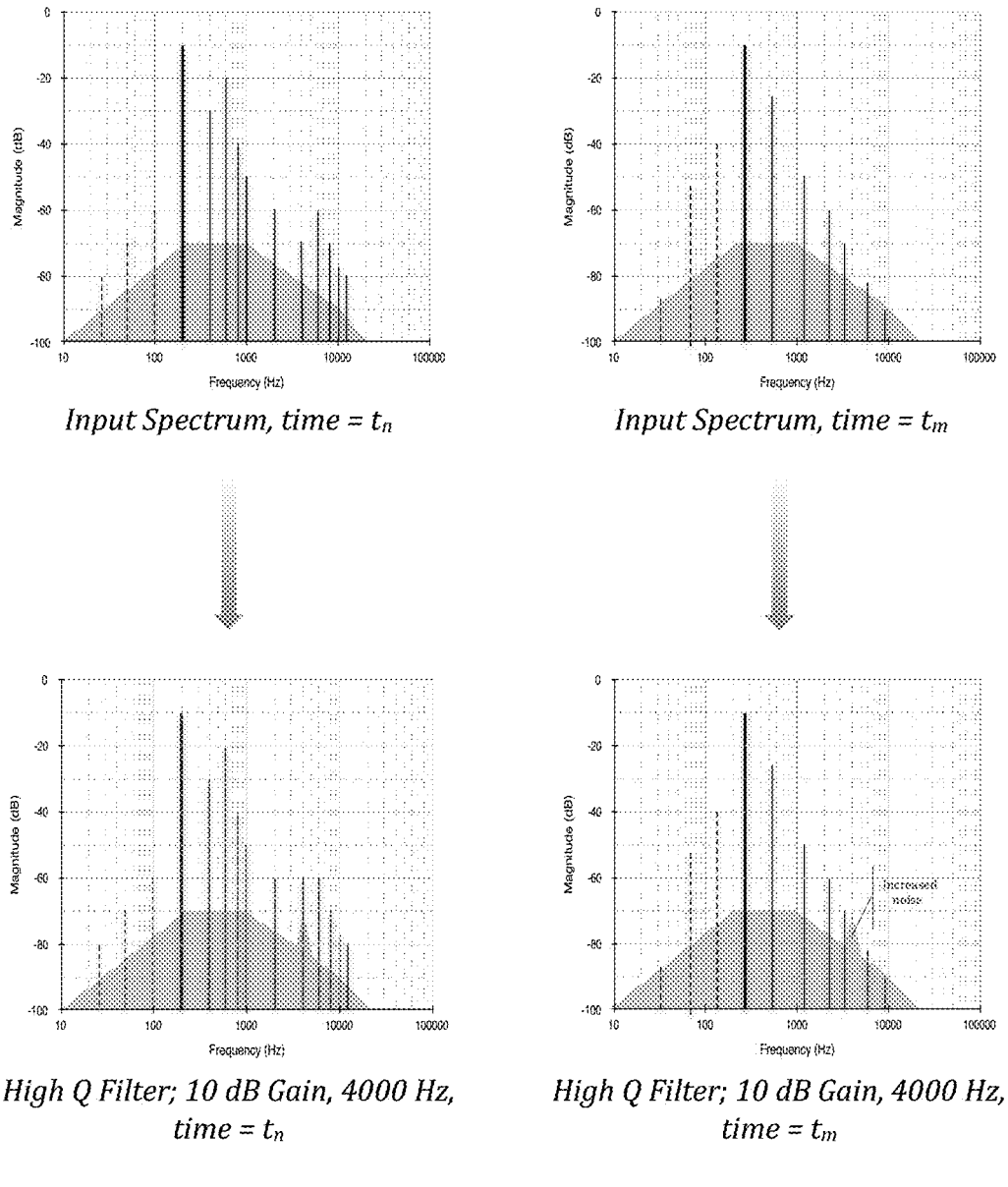
FIG 6. Spectral Components Non-Static Property with Respect to Time and Static Equalization

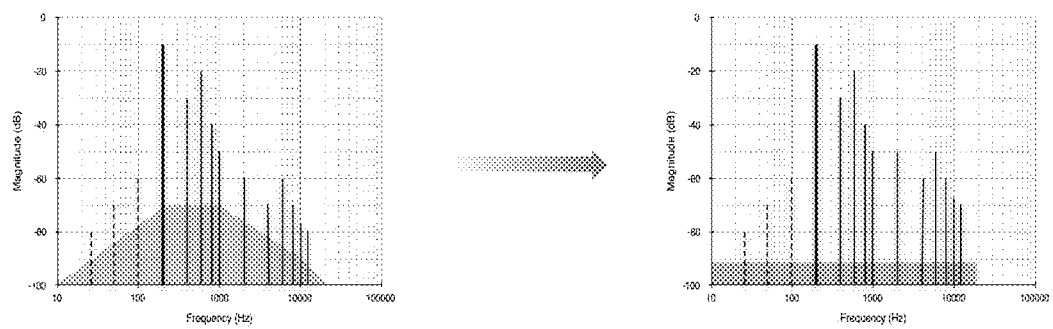
FIG 7. HTEq Noise Reduction Property

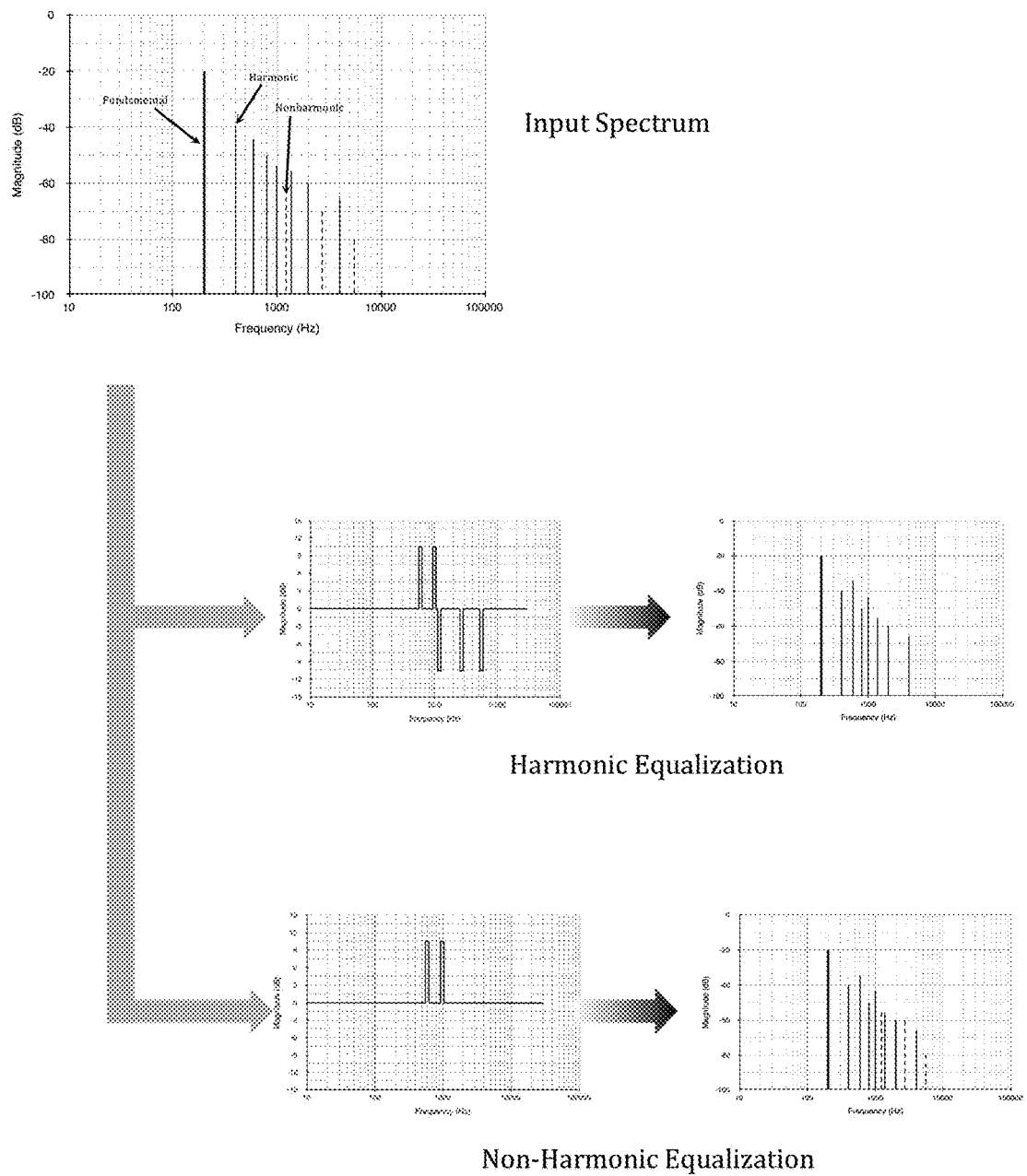
FIG 8. HTEq Harmonic and Non-Harmonic Equalization

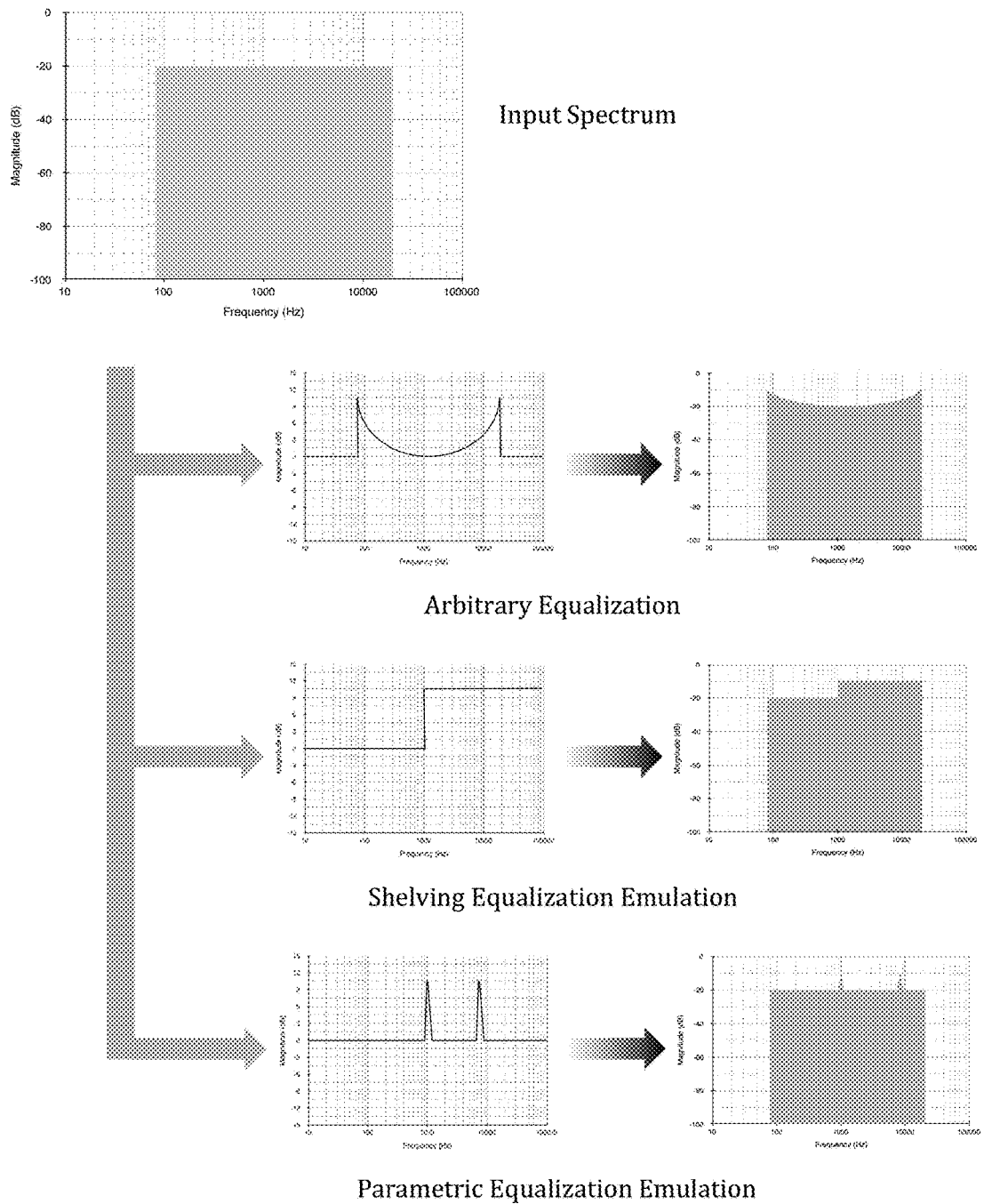
FIG 9. HTEq Arbitrary and Emulation Equalization

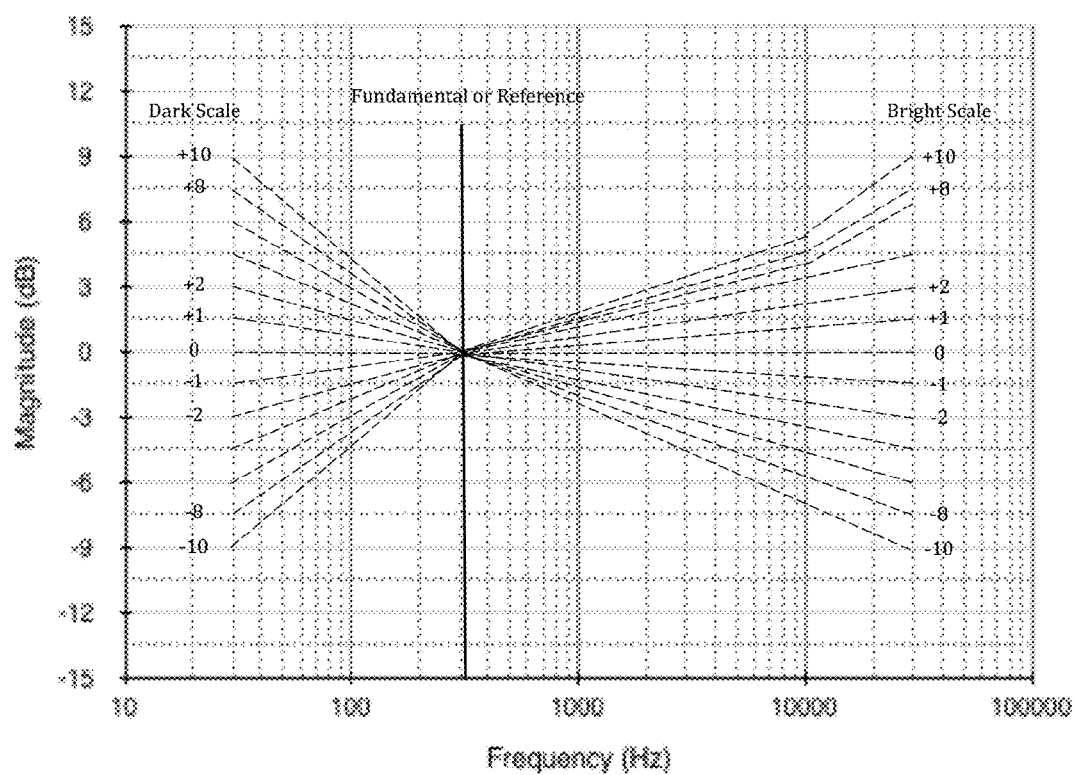
FIG 10. HTEq Arbitrary Specified Equalization and User-Defined Scale

HARMONIC TRACKING EQUALIZER

CROSS-REFERENCE TO RELATED APPLICATIONS

Not Applicable

STATEMENT REGARDING FEDERALLY SPONSORED RESEARCH OR DEVELOPMENT

Not Applicable

REFERENCE TO SEQUENCE LISTING, A TABLE, OR A COMPUTER PROGRAM LISTING COMPACT DISC APPENDIX

Not Applicable

BACKGROUND OF THE INVENTION

The present disclosure relates generally to signal processing of media data, such as signal processing of audio data for quality enhancement.

Equalization processing of an audio signal is commonly used to alter the frequency response of an audio signal to be within a user specified range and is typically achieved by using an equalization filter whose frequency response can be adjusted by a user for one or more reasons, such as the resulting audio signal having improved fidelity, emphasizes certain frequencies or ranges of frequencies, has undesired frequency components such as noise removed, and/or matches perceived timbre of multiple audio signal pieces, such as songs on a CD or multiple compressed MP3 audio signal files. Audio signal equalization is also commonly used in film and television production to improve the quality of the sound, modify and/or match the timbre of audio signal in different scenes or to match individual audio signal streams which comprise a film or television soundtrack. Audio signal equalization can also be used to modify specific frequencies and to make audio signal perceptually louder, as well as to compensate for frequency dependent deficiencies in an audio signal reproduction system.

Background Art: Traditional Equalization:

Many kinds of traditional equalization filters are known, and each has a different behavior with regard to the frequencies that they attenuate or boost (add gain). With traditional equalization, filtering is applied to an audio signal in order to change its frequency spectrum. A peak equalizer raises or lowers a range of frequencies around a central point in a bell shape. A peaking equalizer, with controls to adjust the level (attenuation or gain), filter bandwidth (denoted by Q) and center frequency is called a Parametric Equalizer, with the parameters: gain, bandwidth, and center frequency. A similar peaking equalizer but with no control of the bandwidth, e.g., a bandwidth fixed by the filter designer, is sometimes called a Quasi-Parametric Equalizer or a Semi-Parametric Equalizer.

A Pass Filter Equalizer attenuates either high or low frequencies while allowing other frequencies to pass unfiltered. Such filters include a Low-Pass filter, a High-Pass filter, and a Band-Pass filter that combines the properties of a High-Pass and Low-Pass filter.

Shelving type equalizers increase or attenuate the level of a wide range of frequencies by a fixed amount. A Low-Shelf will affect low frequencies up to a certain point and then above that point will have little effect. A High-Shelf affects the level of high frequencies; while below a certain point, the low frequencies are unaffected.

In many equalization hardware and software implementations, it is not uncommon for all three types of equalizer filters, Peak, Pass and Shelving, to be part of the signal processing path to modify an audio signal.

Another common type of equalizer is a Graphic Equalizer, which includes controllers such as a bank of sliders or other controllers for boosting and cutting different bands (frequency ranges) of an audio signal. Normally, these bands are tight enough to give at least 3 dB or 6 dB maximum effects for neighboring bands, and cover the range from around 20 Hz to 20 kHz. An example of a simple Graphic Equalizer is a 4-band equalizer that might have bands at 20 Hz, 200 Hz, 2 kHz and 20 kHz. A typical Graphic Equalizer for live sound reinforcement might have as many as 24 or 32 bands.

The choice of equalizer is chosen to meet the equalization task and the characteristics of the signal to be processed. The most common types in audio work are the Shelf and the Parametric Equalizers. Each may be implemented in the analog or digital domains. Each equalizer is capable of adding gain or attenuating a signal over a defined band(s) of spectral frequencies. Out-of-band signals are not processed.

Such equalizations, however, do not take into account the time varying nature of the input signal. And, in most cases, they accomplish their equalization tasks while adding undesirable effects (e.g. noise) to the output of the processed signal. The issues noted are particularly significant when processing audio signals due to the deleterious effects that can manifest in unintentional audible inconsistencies and noise. This invention accomplishes the equalization goals without developing these negative issues.

When considering the nature of audio signals in particular, many audio signals consist of one or more "fundamental tones" and additional tones that are related to the fundamental tones. The relationship is one of submultiples or multiples of the fundamental tone. These tones are expressed in frequency terms. For example, a musical instrument may sound an A440 note as a fundamental tone and produce sub-harmonics of A220, A110; as well as harmonics of A880, A1320, and so on. The relative strengths of the tones can vary greatly and influence the perceived musical instrument and tone being played. This nature of audio signals is generally true for voice and musical instruments of string, reed, and wind. This general understanding of audio sound does not apply to instruments like drums and percussive sounds because these instruments do not usually produce harmonically related sound. The analytic and visual display of the tonal content of these composite signals are typically expressed and explored by plotting the frequency content as frequency vs. tonal magnitude. These plots are known as "Spectral" or "Frequency Spectrum" plots.

It is important to note that time variant signals, by definition, are not spectrally stationary. That is, the spectral frequency and magnitude of the components that make up the sound are continually changing over time. Consider an audio signal that is not a singular, constant tone. That signal presents the case where its spectrum over time is not constant. Over time, the spectral fundamental tone(s) and related components are moving within the audio band as well as their magnitudes. Also, fundamentals that are constant may have harmonics (and sub-harmonics) that vary in magnitudes as the tones mature in time. This is the typical case of a person speaking, singing or playing a musical instrument, as examples.

FIG. 2 shows the measured spectrum of a 6-string acoustic guitar. Shown are spectrum of individual strings and a chord struck on the instrument. Notable are the complicated spectral plots and their varying spectral profiles, changing for different strings. In practice, as the different notes of this instrument are sounded, it is clear that a static equalization technique devised for one spectrum will not suffice for the others. Unintended equalization of spectral components or added noise content may result.

Of the known equalization processes, which is best to accomplish the equalization goals?

A Shelving Equalizer is a good choice from the point of view of processing the tone wherever it appears at any given time in the spectral band of equalization interest. The tone will be processed as desired. However, because the Shelf Equalizer processes the entire band of interest, the spectrum where there is no signal is also processed. A typical example is shown in FIG. 3. If the equalizer is adding gain, the noise will also be equalized. This will raise the noise content of the processed signal, certainly an undesirable effect and cannot be avoided. This is illustrated in FIG. 4.

A Parametric Equalizer is another equalization process implemented to achieve the desired goals. It is a spectrum bandwidth-confined equalization process applied to the input signal. As the signal spectrum moves over time and is beyond the defined band of equalizer affectivity, the Parametric Equalizer processing will not act upon the signal; or at best, provide uneven magnitude equalization. Thus, the equalization goal will not be attained, and the noise content will be increased when adding gain to the spectrum specified, as in the case of the Shelving Equalizer.

FIG. 5 illustrates a parametric equalizer with two different Q parameters; low Q and high Q. An equalizer with a high Q will produce an equalization of small bandwidth. The opposite is true of a low Q parametric equalizer. In the case of a high Q equalizer, the equalization is well accomplished for a static frequency component, but not a practical situation. A low Q encompasses a higher bandwidth. This technique may accomplish the desired equalization; however, it will do so while adding noise to the output signal in a similar fashion to the Shelving Equalization filter. It may also unintentionally equalize spectral components. FIG. 6 illustrates an example of a non-static input spectrum equalized by a static parametric equalizer.

The operator of the equalizer also plays a role in choosing correct parameters for the equalizer in order to accomplish the desired equalization task. In the case of the Shelving Equalizer, a frequency is chosen to define the processing band of interest. An operator typically will choose this parameter by identifying the audio source and relying upon an experienced determination. When using a Parametric Equalizer, it becomes much more difficult. The center frequency and width of the filter(s), Q, must be determined. Typically, this can only be accurately accomplished with the aid of instrumentation to define the nature of the signal to be equalized. And, it will only be accurate for a given time. At other times, when the signal's frequency content is out of the processing band, the noise level of the processed signal will be greater, as noted earlier.

BRIEF SUMMARY OF THE INVENTION

There are many variations on the configurations of equipment; however, the underlying issues remain in all cases. For purity of the equalization process, this time-varying nature of the input signal must be considered. Because the input signal to be equalized is non-static, the equalization process must also be non-static. The equalization process must track (follow) the characteristics of the input signal to be effective. This is the nature of the Harmonic Tracking Equalizer (HTEq) invention.

The HTEq accomplishes the main goals: effective equalization of time-variant signals without adding gain to noise spectrum and adds the ability to attenuate noise, allow a user to define the equalization degree without concern for filter spectral placement or bandwidth decision, allow an operator to implement arbitrary full-spectrum equalization definition, and emulate current equalization technology. The HTEq implements these tasks by periodic evaluation of an input in the Frequency Domain, identifying and analyzing signal components (harmonic and non-harmonic) and acting upon them as requested using Convolution Filter processing.

The HTEq is able to accomplish an additional set of goals: automatic equalization based upon input signal amplitude and/or Reference Frequency. Given a determination of input signal amplitude, the HTEq is able to choose from a set of user-defined Equalization Profiles. In this manner, an appropriate Equalization Profile may be chosen. For example, emphasis on low and high frequencies may be applied when the input amplitude is low and the opposite when amplitude is high. Also, as Reference Frequencies vary from low to high, different Equalization Profiles may be applied. In this manner, the equalization process compensates for perceived hearing.

An additional benefit of the HTEq is the attenuation or negation of noise and unwanted spectral content. Because the Equalization Profile is defined by Frequency Sets that are not stationary in frequency and track the input, the HTEq can readily identify other frequency content that is not included therein and attenuate the undesirable in a time-varying manner. By a definition, any spectral components that are not signal, are considered noise and detrimental to the output signal. As an option, the HTEq is able to identify all spectral components that are not signal and attenuate them to a user-defined level as specified in an Equalization profile. Thus, increasing the Signal to Noise Ratio of the output, an enhancement of the input signal.

BRIEF DESCRIPTION OF THE SEVERAL VIEWS OF THE DRAWINGS

In all figures, equalization in the form of gain is added to illustrate the detrimental effects of current equalization techniques and the advantages of the HTEq invention. Attenuation equalization may also be applied to the input signals. While, examples of attenuation are applicable and illustrate the advantages of the HTEq, the application of gain better notes the benefits of the HTEq and is used herein.

FIG. 1 is a Functional Block Diagram of the HTEq invention. It depicts all functional components and interfaces.

FIG. 2 illustrates the issues addressed by the HTEq. This figure shows the spectrums of individual strings and a "G Chord" produced by the same "6-string" acoustic guitar, as an example of typical input spectra noting the differing structure of the sound for fundamental, harmonic, and sub-harmonic tones. It is notable that many non-harmonic tones are also present in the spectra.

FIG. 3 notes an input of theoretical signal components consisting of fundamental, harmonic, and sub-harmonic frequencies along with a noise spectrum. This signal, or similar, is used as an input to other figures for illustrative purposes.

FIG. 4 is an example of a current Shelving Equalization technique. It illustrates the added noise content of this technique. Noise spectral components are added where no equalization of signal component exists. It is neither necessary nor desirable. Added noise, typically perceived as background "hiss", can be heard in outputs as increasing gain in equalization is introduced.

FIG. 5 is an example of a current Parametric Equalization technique. Two examples are depicted; a high Q filter (low spectral bandwidth) and a low Q filter (high spectral bandwidth). Static spectral equalization filters are shown.

In the high Q filter case, the applied spectrally narrow filter gain is applied to a component of the input signal, introducing a minimum of noise. However, the spectral placement (filter center frequency) of this filter by an operator or user is difficult to determine without instrumentation, not available on typical equipment. A wider bandwidth (low Q) filter or more than a single high Q filter is typically required.

A low Q filter is applied to the input spectrum in the second case. A wider filter is typically applied to overcome an inability to accurately determine the filter spectral placement or to compensate for the non-static spectral nature of the input signal. The disadvantage of this process is the added equalized noise to the signal output.

FIG. 6 illustrates a further inadequacy of the Parametric Equalization filer. At a given time $t_n$, a spectral component is identified and equalized. However, at time $t_m$, the non-static nature of the input signal illustrates that the spectral components are no longer present at the statically specified filter spectral placement. Noise has been added to the signal output. In addition, if required, equalization of the input signal at specific frequencies has not been achieved.

FIG. 7 illustrates the ability of the HTEq to generally reduce the noise content of the output signal. The HTEq can match the signal component(s) of the input with or without adding attenuation or gain. Noise not part of the input signal components is vastly reduced, improving the output Signal to Noise Ratio.

FIG. 8 notes the differences in the Harmonic and Non-harmonic operation of the HTEq. In Harmonic operation, non-harmonic spectral components are either filtered from the output (or a gain or attenuation may be arbitrarily applied to non-harmonic spectral components). In Non-harmonic operation, all signal components are processed.

FIG. 9 examples depict the ability of the HTEq to apply an arbitrary equalization profile to a spectral input. Also shown are equalization emulations of Shelving and Parametric equalizers.

FIG. 10 shows an example of a set of equalization profiles determined by a user-defined input scale. Two scales are shown; Bright and Dark. A Reference Frequency is defined. The equalization profiles are scaled or may arbitrarily differ in spectral profile.

DETAILED DESCRIPTION OF THE INVENTION

Described herein is an apparatus for and improved methods of carrying out dynamic equalization processing of an audio signal and methods of controlling such equalization processing to dynamically adjust the time varying spectrum to match a user specified target audio signal spectrum with low noise content.

In all cases, the HTEq only equalizes an input signal where a signal component is present in the input spectrum. FIG. 8 depicts the difference between the two operational processing of the HTEq; Harmonic and Non-harmonic operation.

In Harmonic operation, sets of Reference, Harmonic, and Sub-Harmonic input frequency components are automatically determined and noted for equalization. All other spectral regions are negated or set to a user-defined value. Once a Reference frequency is determined (for each set of frequencies) by noting the maximum magnitude component, harmonic and sub-harmonic components are readily defined for processing. A Frequency Set is determined as the set of frequency components including the Reference as well as other components having higher frequency, related by a multiple of the Reference frequency (harmonic components), and lower frequency components related by a sub-multiple (sub-harmonics). Harmonic frequency components are subjected to user-defined Bright equalization processing. Sub-harmonic frequency components are subjected to user-defined Dark equalization processing.

In Non-harmonic operation, where harmonic frequency sets are not determined, the Frequency Set is determined by the existence of values exceeding a user-defined threshold. Only one Frequency Set will be defined. Like a Fundamental Frequency, a Reference Frequency is defined as the highest magnitude component and is used to demarcate between Bright and Dark equalization processing.

In an automatic operation, the HTEq may be requested to self-determine the presence of a harmonic or non-harmonic spectral input. In this case, the HTEq will make this determination based upon the ratio of harmonic to non-harmonic content. Upon this determination, the HTEq will automatically switch between Harmonic and Non-harmonic operation. Automatic operation is useful in situations where the spectral content of the input signal varies between harmonic and non-harmonic content. For example, the spoken word "bush" contains both types of content at different times in its pronunciation. The "bu" sound contains harmonics in its spectral make-up, while the "sh" sound contains non-harmonic content. This situation requires that the HTEq automatically detect and process the equalization using the proper operation.

Frequency Sets are determined at a rate significant to the sampling of the input spectra and affectivity of equalization.

Also, the HTEq has a unique ability to equalize an input signal while negating noise. FIG. 7 illustrates a noisy input with signal components. The HTEq can identify the signal components by a simple threshold check of magnitude and highly attenuate all other frequencies that are below the threshold. The output generated will be a "clean" audio signal of the input.

Equalization profiles are user-defined or preset. They can be of any arbitrary spectral envelope and are separate for brightening (Bright Eq Profile) and darkening (Dark Eq Profile) the input signal. The user defines gain and attenuation equalization profiles. Because arbitrary equalization profiles are possible, it is notable that the HTEq is capable of emulating Shelving and Parametric filter techniques, as shown in FIG. 9. However, the emulation of these techniques will not encounter the inherent inadequacies of the current technology. An example of differing arbitrary Dark and Bright equalization profiles that illustrates different equalization profiles is shown in FIG. 10.

In either Harmonic or Non-harmonic operation, the Reference of each Frequency Set tracks the input, resulting in a non-stationary Reference frequency component. Equalization profiles are "anchored," to that frequency.

Upon definition of these sets of components and the equalization profile, the equalization is accomplished via Convolution Filtering in the Frequency Domain. The input spectrum undergoes a complex convolution with the equalization profile. A common Digital Signal Processing method, such as "Overlap and Add," is then performed to transform the resulting signal information to the Time Domain where it is then used to develop an analog or digital signal for output.

Summarizing, the issues with traditional equalizers are detrimental added noise, static equalization in a non-static environment, and the choice of user-defined equalizer parameters is not intuitive. Each of these issues result in an output that is not as pure as needed when considering audio implementations. The HTEq addresses each of these issues.

The HTEq is able to negate input signal spectrum noise by attenuating the spectral regions where no signal of interest is determined to exist. It accomplishes this by setting those spectral regions in the equalization profile to a user-defined degree of attenuation. This process is accomplished in the Frequency Domain and is then realized in the Convolution Filtering. The HTEq addresses the non-static input signal by repeated spectrum definition and equalization processing at a rate faster than the input spectrum is able to change. In this manner, current frequency components of the input signal are identified as the input spectrum character undergoes change. At any given time, the desired equalization is applied to the input signal per a desired equalization profile. The user defines the nature of the audio output in terms of Bright and Dark parameters, while the HTEq continually tracks the input to deliver the desired audio output. The user is not encumbered with continually changing equalization parameter definition and a superior audio output is produced.

This HTEq functionally consists of Input Buffer/Signal Conditioning, Analog to Digital Conversion, Spectrum Definition, Spectrum Analysis, Equalization Definition, Convolution Filter, Temporal Construction, Digital to Analog Conversion, and Output Buffer/Signal Conditioning. Also, ancillary functions for Control/Status and Storage/Recall are included. A functional diagram is shown in FIG. 1.

Input Buffer/Signal Conditioning:

The Input Buffer/Signal Conditioning supplies the input to further processing. It buffers the input signal, including impedance matching, in order that the apparatus does not provide a significant electrical load to the source. It negates out-of-band noise, typically less than 20 Hz and greater than 20 kHz. It also contains the ability to negate AC power frequencies, 50/60 Hz. These abilities will severely attenuate "low-end" rumble and high frequency noise beyond the audible range that will adversely affect the output. It also accepts digital signals of defined format, optionally filtering these signals as in the analog domain. An automatic or operator selected choice of analog or digital input is then passed for further processing.

Analog to Digital Conversion:

The conversion of analog signals to the digital domain follows. A conversion of the analog input signal to the digital domain using an Analog-to-Digital Converter is accomplished.

Spectrum Definition:

A Spectrum Definition is then calculated for the current input data, typically accomplished using a Fast Fourier Transform (FFT) algorithm.

Spectrum Analysis:

In the case of Harmonic operation, an analysis of the Spectral Definition is accomplished to determine the current Frequency Set(s); Reference, Harmonic, and Sub-Harmonic frequencies in the current input data. In Non-harmonic operation, a Reference Frequency is determined by examination of the spectra data for maximum values. A threshold is first applied to the spectral data to negate noise components and avoid false or unnecessary processing.

Spectral frequency/magnitude thresholds are optionally applied to reduce spectral components that are determined to be audibly nonessential or to reduce processing requirements.

Equalization Definition:

Once the Frequency Set(s) (Harmonic operation) or a Reference Frequency (Non-harmonic operation) is defined, input parameters from a local or remote control interface specify the requested equalization in terms of an integer scale (e.g. −10 to +10). Each scale choice defines a previously determined arbitrary equalization profile. Zero would indicate a "bypass" equalization request. Requested equalization control parameters are provided for "Bright" and "Dark." With this information, a Gain/Attenuation value is associated with each signal component. Other frequency components are set to 0 (dB) or a user-defined value. A full spectrum equalization profile is thus defined. It is noted that the equalization profiles may differ by scale type (Dark, Bright) or integer scale choice.

Optionally, with the provided input of amplitude, the apparatus is automatically capable of choice of user-defined Equalization Profile based upon input "magnitude" and spectral position. As an example, this operation may be used to compensate for necessary equalization as defined in the "Fletcher-Munson" curves. This set of curves defines hearing perception vs. loudness. To maintain a desired equalization at all sound levels, it is necessary to modify the equalization in order to perceive a constant equalization across all loudness levels. To accomplish this, at low volume levels, it is necessary to either boost low and high spectral frequencies or attenuate mid frequencies. The opposite is applicable at high loudness levels. This is useful for live, playback, and studio environments.

Convolution Filter:

The input spectrum and the Equalization Spectrum are convolved in the Frequency Domain using a Convolution Filter algorithm.

Temporal Construction:

An Inverse Fast Fourier Transform (IFFT) algorithm is then performed on the spectral data determined in the Convolution Filter block. For real-time operation, a method such as the "Overlap and Add" technique is used, resulting in equalized audio digital data in the Time Domain. For non-real time operation, simpler temporal construction techniques may be implemented.

Digital to Analog Conversion:

Where required, the temporal digital data is converted to an analog signal.

Output Buffer/Signal Conditioning:

The resultant signal (analog or digital) is electrically buffered and filtered accordingly for output.

Control/Status and Storage/Recall:

Interfaces for local/remote control and status are provided.

In addition, provision is made for the saving and recall of configuration data. An interface to "back-Up" and archive this data to an external device is also provided.

I claim:

1. A method of dynamically equalizing an input signal, the method comprising:
    one of harmonically spectrally analyzing the input signal to determine a reference frequency, harmonics of the reference frequency, and sub-harmonics of the reference frequency and non-harmonically spectrally analyzing the input signal to determine frequencies having a magnitude greater than a user defined threshold including a reference frequency wherein the reference frequency is the input signal's highest magnitude spectral frequency;

creating an equalization profile based on user defined parameters for the one of the reference frequency, harmonics of the reference frequency, and sub-harmonics of the reference frequency and the frequencies having a magnitude greater than the user defined threshold, and applying the equalization profile to the input signal spectrum to dynamically equalize the input signal.

2. The method of dynamically equalizing an input signal as recited in claim 1, wherein the input signal is an audio signal.

3. The method of dynamically equalizing an input signal as recited in claim 1, enabling a user to select to one of harmonically spectrally analyzing the input signal and non-harmonically spectrally analyzing the input signal.

4. The method of dynamically equalizing an input signal as recited in claim 1, further including enabling a user to define the parameters for the one of the determined reference frequency, harmonics of the reference frequency, and sub-harmonics of the reference frequency and the determined frequencies having a magnitude greater than the user defined threshold.

5. The method of dynamically equalizing an input signal as recited in claim 1, further including enabling a user to define equalization profiles based on the reference frequency and applying an equalization profile defined by a User based on the determined reference frequency to the input signal spectrum.

6. The method of dynamically equalizing an input signal as recited in claim 1, including dynamically equalizing the input signal by applying user defined parameters to one of the determined reference frequency, harmonics of the reference frequency, and sub-harmonics of the reference frequency and the determined frequencies having a magnitude greater than the user defined threshold and applying user defined parameters to the other of the input signal spectrum.

7. The method of dynamically equalizing an input signal as recited in claim 6, wherein dynamically equalizing the input signal by applying user defined parameters to one of the determined reference frequency, harmonics of the reference frequency, and sub-harmonics of the reference frequency and the determined frequencies having a magnitude greater than the user defined threshold and applying user defined parameters to the other of the input signal spectrum includes creating an equalization profile based on user defined parameters for the one of the reference frequency, harmonics of the reference frequency, and sub-harmonics of the reference frequency and the frequencies having a magnitude greater than the user defined threshold and the user defined parameters for the other of the input signal spectrum and applying the equalization profile to the input signal spectrum.

8. The method of dynamically equalizing an input signal as recited in claim 7, wherein the user defined parameters for the other of the input signal spectrum include attenuation levels.

9. The method of dynamically equalizing an input signal as recited in claim 1, wherein the input signal is an analog audio signal and further including converting the analog audio signal to a digital audio signal.

10. A method of dynamically equalizing an input signal the method comprising:

harmonically spectrally analyzing the input signal to determine a reference frequency, harmonics of the reference frequency, and sub-harmonics of the reference frequency and non-harmonically spectrally analyzing the input signal to determine frequencies having a magnitude greater than a user defined threshold including a reference frequency wherein the reference frequency is the input signal's highest magnitude spectral frequency;

determining the energy content of the reference frequency, and sub-harmonics of the reference frequency and the energy content of the frequencies having a magnitude greater than a user defined threshold;

creating an equalization profile based on user defined parameters for the one of the reference frequency, harmonics of the reference frequency, and sub-harmonics of the reference frequency and the frequencies having a magnitude greater than the user defined threshold having the greater energy content; and applying the equalization profile to the input signal spectrum to dynamically equalize the input signal.

11. The method of dynamically equalizing an input signal as recited in claim 10, further including enabling a user to define the parameters for the determined reference frequency, harmonics of the reference frequency, and sub-harmonics of the reference frequency and the determined frequencies having a magnitude greater than the user defined threshold.

12. The method of dynamically equalizing an input signal as recited in claim 10, dynamically equalizing the input signal by applying user defined parameters to one of the determined reference frequency, harmonics of the reference frequency, and sub-harmonics of the reference frequency and the determined frequencies having a magnitude greater than the user defined threshold having the greater energy content and applying user defined parameters to the other of the input signal spectrum.

13. The method of dynamically equalizing an input signal as recited in claim 10, wherein dynamically equalizing the input signal by applying user defined parameters to one of the determined reference frequency, harmonics of the reference frequency, and sub-harmonics of the reference frequency and the determined frequencies having a magnitude greater than the user defined threshold having the greater energy content includes creating an equalization profile based on user defined parameters for the one of the reference frequency, harmonics of the reference frequency, and sub-harmonics of the reference frequency and the frequencies having a magnitude greater than the user defined threshold having the greater energy content and (Previously Presented) user defined parameters for the other of the input signal spectrum and applying the equalization profile to the input signal spectrum.

14. The method of dynamically equalizing an input signal as recited in claim 13, wherein the user defined parameters for the other of the input signal spectrum include attenuation levels.

15. The method of dynamically equalizing an input signal as recited in claim 10, wherein the input signal is an analog audio signal and further including converting the analog audio signal to a digital audio signal.

16. A method of dynamically equalizing an audio signal, the method comprising:

harmonically spectrally analyzing the audio signal to determine a reference frequency, harmonics of the reference frequency, and sub-harmonics of the reference frequency wherein the reference frequency is the audio signal's highest magnitude spectral frequency;

creating an equalization profile based on user defined parameters for the reference frequency, harmonics of the reference frequency, and sub-harmonics of the reference frequency; and dynamically equalizing the audio signal by applying user defined parameters to the determined reference frequency, harmonics of the reference frequency, and sub-harmonics of the reference frequency by applying the equalization profile to the audio signal spectrum.

17. The method of dynamically equalizing an audio signal as recited in claim 16, further including enabling a user to define the parameters for the determined reference frequency, harmonics of the reference frequency, and sub-harmonics of the reference frequency.

18. The method of dynamically equalizing an audio signal as recited in claim 16, including creating an equalization profile based on user defined parameters for the reference frequency, harmonics of the reference frequency, sub-harmonics of the reference frequency, and user defined parameters for the other of the audio signal spectrum.

\* \* \* \* \*